United States Patent
Tatami et al.

(10) Patent No.: US 11,447,696 B2
(45) Date of Patent: Sep. 20, 2022

(54) FLUORESCENT MEMBER, ITS MANUFACTURING METHOD, AND LIGHT-EMITTING APPARATUS

(71) Applicant: KANAGAWA INSTITUTE OF INDUSTRIAL SCIENCE AND TECHNOLOGY, Kanagawa (JP)

(72) Inventors: Junichi Tatami, Kanagawa (JP); Emi Takahashi, Kanagawa (JP); Takuma Takahashi, Kanagawa (JP)

(73) Assignee: KANAGAWA INSTITUTE OF INDUSTRIAL SCIENCE AND TECHNOLOGY, Kanagawa (JP)

( * ) Notice: Subject to any disclaimer, the term of this patent is extended or adjusted under 35 U.S.C. 154(b) by 0 days.

(21) Appl. No.: 17/273,263

(22) PCT Filed: Jul. 22, 2020

(86) PCT No.: PCT/JP2020/028517
§ 371 (c)(1),
(2) Date: Mar. 3, 2021

(87) PCT Pub. No.: WO2021/015261
PCT Pub. Date: Jan. 28, 2021

(65) Prior Publication Data
US 2021/0317367 A1    Oct. 14, 2021

(30) Foreign Application Priority Data

Jul. 22, 2019 (JP) .............................. JP2019-134868

(51) Int. Cl.
| | |
|---|---|
| *C09K 11/77* | (2006.01) |
| *C09K 11/02* | (2006.01) |
| *H01L 33/50* | (2010.01) |
| *C04B 35/645* | (2006.01) |
| *C04B 35/053* | (2006.01) |
| *C04B 41/45* | (2006.01) |
| *C04B 41/50* | (2006.01) |
| *C09K 11/08* | (2006.01) |

(52) U.S. Cl.
CPC ...... *C09K 11/77348* (2021.01); *C04B 35/053* (2013.01); *C04B 35/645* (2013.01); *C04B 41/4578* (2013.01); *C04B 41/502* (2013.01); *C09K 11/02* (2013.01); *H01L 33/502* (2013.01); *C04B 2235/30* (2013.01); *C04B 2235/3206* (2013.01); *C04B 2235/3852* (2013.01); *C04B 2235/5436* (2013.01); *C04B 2235/5454* (2013.01); *C04B 2235/616* (2013.01); *C04B 2235/66* (2013.01); *C04B 2235/77* (2013.01); *C09K 11/0883* (2013.01)

(58) Field of Classification Search
CPC .............. C09K 11/77348; C09K 11/02; C09K 11/0883; H01L 33/502; C04B 35/053; C04B 35/645; C04B 41/4578; C04B 41/502; C04B 2235/30; C04B 2235/3206; C04B 2235/2852; C04B 2235/5436; C04B 2235/5454; C04B 2235/616; C04B 2235/66; C04B 2235/77
See application file for complete search history.

(56) References Cited

U.S. PATENT DOCUMENTS

| | | |
|---|---|---|
| 2009/0009059 A1 | 1/2009 | Kwon et al. |
| 2013/0062648 A1 | 3/2013 | Nishimura |
| 2019/0185744 A1 | 6/2019 | Takahashi et al. |

FOREIGN PATENT DOCUMENTS

| | | |
|---|---|---|
| JP | H0525475 A | 2/1993 |
| JP | 2008066462 A | 3/2008 |
| JP | 2009013412 A | 1/2009 |
| JP | 2013062320 A | 4/2013 |
| JP | 2018180271 A | 11/2018 |
| KR | 20100000221   * | 1/2010 |
| KR | 20100000221 A | 1/2010 |
| WO | 2018038259 A1 | 3/2018 |

OTHER PUBLICATIONS

M.W. Shafer et al., "Rare-Earth Polymorphism and Phase Equilibria in Rare-Earth Oxide-Water Systems", Journal of The American Ceramic Society, Nov. 1959, vol. 42, No. 11, pp. 563-570.
Yulong Liu et al., "Development of the Cold Sintering Process and Its Application in Solid-State Lithium Batteries", Journal of Power Sources 393, published 2018, pp. 193-203.

(Continued)

*Primary Examiner* — C Melissa Koslow
(74) *Attorney, Agent, or Firm* — Fay Sharpe, LLP

(57) ABSTRACT

A fluorescent member according to present invention is composed of a sintered body for wavelength conversion containing a matrix containing magnesium oxide and magnesium hydroxide as main components, and phosphor particles dispersed in the matrix. A thermal conductivity of the fluorescent member is preferably 5 W/(m·K) or higher. A fluorescent member having both a satisfactory thermal conductivity and a satisfactory fluorescent property is provided without requiring a high-temperature sintering process (a high-temperature process at a temperature higher than 250° C.). Further, a method for manufacturing such a fluorescent member and a light-emitting apparatus using such a fluorescent member are provided.

10 Claims, 8 Drawing Sheets

(56) References Cited

OTHER PUBLICATIONS

Jing Guo et al., "Cold Sintering Process: A New Era for Ceramic Packaging and Microwave Device Development", Journal of the American Ceramic Society, 2017; 100: 669-677, Jul. 15, 2016, 9 pages.

Shuichi Funahashi et al., "Demonstration of the Cold Sintering Process Study for the Densification and Grain Growth Of ZnO Ceramics", Journal of the American Ceramic Society, 2017; 100: 546-553, May 25, 2016, 8 pages.

Hanzheng Guo et al., "Cold Sintering Process: A Novel Technique for Low-Temperature Ceramic Processing of Ferroelectrics", Journal of the American Ceramic Society, vol. 99, No. 11, 3489-3507, Oct. 13, 2016, 19 pages.

* cited by examiner

200nm

200nm

FLUORESCENT MEMBER, ITS MANUFACTURING METHOD, AND LIGHT-EMITTING APPARATUS

TECHNICAL FIELD

The present invention relates to a fluorescent member and a method for manufacturing a fluorescent member. Further, the present invention relates to a light-emitting apparatus including a semiconductor light-emitting element and the aforementioned fluorescent member.

BACKGROUND ART

Light-emitting apparatus equipped with semiconductor light-emitting elements such as light-emitting diodes (LEDs: Light Emission Diodes) or laser diodes (LDs: Laser Diodes) are excellent in low power consumption and long life, and are used for lighting apparatuses, backlights for liquid crystal display devices, or light sources of laser devices. Among such LEDs, white LEDs have been widely and increasingly used as alternative lighting elements to fluorescent lamps.

For such white LEDs, a technique for emitting white light by combining a light-emitting diode serving as a primary light source with a fluorescent member has been known. As such a fluorescent member, a molded object obtained by dispersing phosphor particles in a resin has been developed. By using a resin as a matrix of a fluorescent member, its moldability becomes excellent. However, such a fluorescent member tends to have a high temperature due to heat generated from the light-emitting diodes, which are the primary light source, and heat caused by the loss in energy conversion in the excitation-to-light-emission process in the fluorescent member, thus causing a problem that the resin (the matrix) having a low thermal conductivity and a low heat resistance degrades. This problem becomes particularly serious when high-power LEDs or high-power lasers are used.

Therefore, as a matrix in which phosphor particles are dispersed, phosphor-dispersed glass in which phosphor particles are dispersed, instead of in a resin, in glass having an excellent heat resistance, and phosphor-dispersed YAG ceramics in which Ce:YAG phosphor particles, which is a yellow phosphor, are dispersed in transparent YAG ceramics have been reported. Further, phosphor-dispersed sialon ceramics in which phosphor particles are dispersed in a matrix composed of a sialon-based compound has been proposed (Patent Literature 1). Further, a wavelength-conversion member in which inorganic phosphor particles are dispersed in magnesium oxide has been proposed (Patent Literature 2). Further, an attempt to convert the whole plate into a phosphor has also been made.

Note that although it is not an example of an application of a fluorescent member, a method for sintering ceramics by using a "low-temperature sintering" method, which will be described later in the "Solution to Problem" section, has been reported (Non-patent Literatures 1 to 5).

CITATION LIST

Patent Literature

Patent Literature 1: International Patent Publication WO2018/38259
Patent Literature 2: Japanese Unexamined Patent Application Publication No. 2018-180271

Non Patent Literature

Non-patent Literature 1: Journal of The American Ceramic Society-Shnjer and Koy, M. W. SHAFER et al. Vol. 42, No. 11, November 1959
Non-patent Literature 2: J. Am. Ceram. Soc., Clive A. Randall et al., 99 [11] 3489-3507, 2016
Non-patent Literature 3: J. Am. Ceram. Soc., Clive A. Randall et al., 100: 546-553, 2017
Non-patent Literature 4: J. Am. Ceram. Soc., Clive A. Randall et al., 100: 669-677, 2017
Non-patent Literature 5: Journal of Power Sources, Xueliang Sun et al., 393: 193-203, 2018

SUMMARY OF INVENTION

Technical Problem

The above-described method for converting the whole plate into a phosphor requires high-temperature sintering, thus causing a problem that the types that can be densified are limited. According to the method disclosed in Patent Literature 2, temperatures of 1,000 to 1,400° C. are shown as examples of the sintering temperature. Further, the fluorescent member in which sialon is used as a matrix requires, for example, a high-temperature sintering process of about 1,000 to 1,500° C. in order to densify the matrix. When such a high temperature treatment is carried out, there is a problem that the dispersed phosphor particles tend to degrade. Further, it is necessary to exclude any combination in which the matrix reacts with the phosphor particles at a high temperature, thus causing a problem that the usable phosphor particles are limited. Meanwhile, the fluorescent member in which glass is used as the matrix can be converted into a plate at a relatively low temperature. However, the thermal conductivity of glass is intrinsically low, so it is difficult to apply such a fluorescent member to the aforementioned high-power LEDs and the laser-excited lighting.

In these days, there are a lot of needs for light-emitting apparatuses for high-power uses, and as described above, it has been strongly desired to develop a fluorescent member having an excellent thermal conductivity and capable of efficiently dissipate heat generated due to the rise in temperature of light-emitting diodes or laser diodes themselves and heat caused by the loss in energy conversion in the excitation-to-light-emission process.

Note that although the problems in white LEDs and the like have been described above, similar problems may occur in the whole types of fluorescent members.

The present invention has been made in view of the above-described circumstances, and an object thereof is to provide a fluorescent member having both a satisfactory thermal conductivity and a satisfactory fluorescent property without requiring a high-temperature sintering process (a high-temperature process at a temperature higher than 250° C.), and to provide a method for manufacturing such a fluorescent member and a light-emitting apparatus using such a fluorescent member.

Solution to Problem

[1]: A fluorescent member, the fluorescent member being composed of a sintered body for wavelength conversion, the sintered body containing:
a matrix containing magnesium oxide and magnesium hydroxide as main components; and
phosphor particles dispersed in the matrix.

[2]: The fluorescent member described in Item [1], in which a thermal conductivity of the fluorescent member is 5 W/(m·K) or higher.

[3]: The fluorescent member described in Item [1] or [2], in which a mass ratio of the magnesium hydroxide to the magnesium oxide in the matrix is 0.4 or lower.

[4]: The fluorescent member described in any one of Items [1] to [3], in which the phosphor particles contain nitride phosphor particles.

[5]: The fluorescent member described in any one of Items [1] to [4], in which a relative density of the fluorescent member is 85% or higher.

[6]: The fluorescent member described in any one of Items [1] to [5], in which the sintered body is obtained by:

obtaining a preform made of a mixture of at least a raw-material powder of the matrix and the phosphor particles; and impregnating the preform with water and then sintering the preform under pressure, and the sintered body is obtained without performing a high-temperature process at a temperature higher than 250° C. for the preform impregnated with the water.

[7]: The fluorescent member described in Item [6], in which an average particle diameter of the magnesium oxide in the matrix obtained by an intercept method according to ISO13383-1:2012 is 0.1 μm to 10 μm.

[8]: A light-emitting apparatus including:

a semiconductor light-emitting element capable of emitting first light; and a fluorescent member described in any one of Items [1] to [7] disposed on an emitted-light side of the semiconductor light-emitting element, the fluorescent member being capable of emitting second light by using the first light as excitation light.

[9]: A method for manufacturing a fluorescent member including:

obtaining a mixture by mixing at least a raw-material powder of a matrix and phosphor particles;

obtaining a preform by preforming the mixture; and obtaining a sintered body by impregnating the preform with water and then sintering the preform under pressure, in which the method does not include any process in which the preform impregnated with the water is processed at a high-temperature higher than 250° C., and the matrix contains magnesium oxide and magnesium hydroxide as main components.

[10]: The method for manufacturing a fluorescent member described in Item [9], in which an average particle diameter of the magnesium oxide as the raw-material powder, which is obtained from a specific surface area and a density, is 20 nm or larger.

Advantageous Effects of Invention

According to the present invention, it is possible to provide a fluorescent member having both a satisfactory thermal conductivity and a satisfactory fluorescent property without requiring a high-temperature sintering process (a high-temperature process at a temperature higher than 250° C.), and to provide a method for manufacturing such a fluorescent member and a light-emitting apparatus using such a fluorescent member.

DESCRIPTION OF EMBODIMENTS

Figure 1:
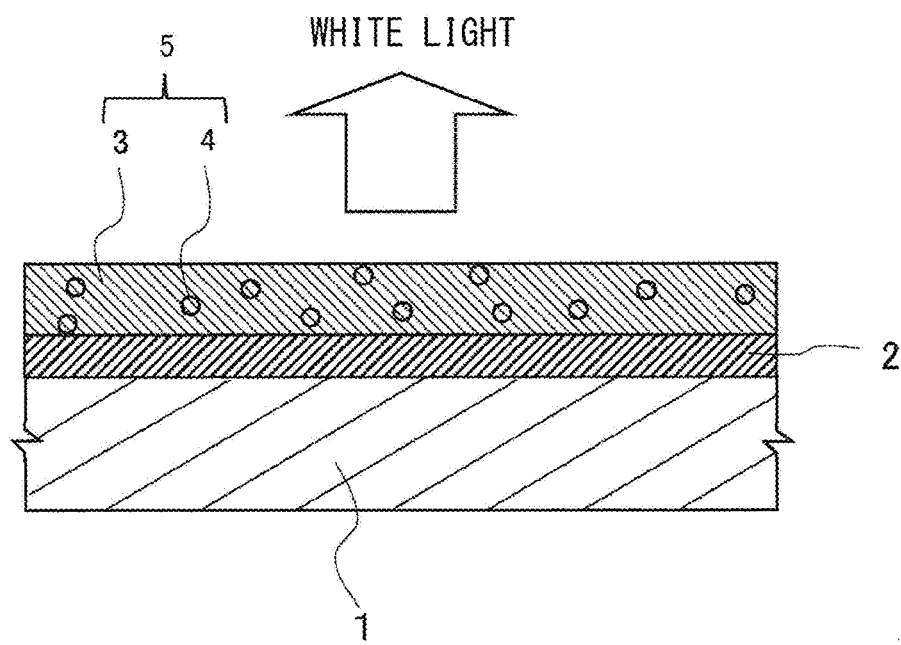
FIG. 1 is a schematic cross-sectional diagram showing an example of a light-emitting apparatus according to an embodiment.

Examples of embodiments to which the present invention is applied will be described hereinafter. Note that other embodiments also fall within the scope of the present invention as long as they are consistent with the spirit of the present invention. Further, numerical values specified in this specification are determined by a method disclosed in an embodiment or an example. For clarifying the explanation, the following descriptions and the drawings are simplified as appropriate. Further, matters that are necessary for carrying out the present invention but are not specifically described in this specification may be understood as those skilled in the art based on the related art in this field.

[Fluorescent Member]

A fluorescent member according to this embodiment is composed of a sintered body for wavelength conversion containing a matrix containing magnesium oxide and magnesium hydroxide as main components, and phosphor particles dispersed in the matrix. The shape of the fluorescent member is, for example, a disk shape, a flat plate shape, a convex lens shape, a concave lens shape, a spherical shape, a hemispherical shape, a cubic shape, a rectangular-parallelepiped shape, a columnar shape such as a rectangular (or square) columnar shape and a circular columnar shape, or a cylindrical shape such as a rectangular (or square) cylindrical shape and a circular cylindrical shape. When the present invention is applied to a white LED(s), a fluorescent member according to this embodiment can be used by disposing it, for example, on the emitted-light side of a blue LED(s) which serves as an excitation-light source.

In the fluorescent member, the phosphor particles absorb at least a part of first light emitted from a semiconductor light-emitting element or the like as excitation light and emit second light. Note that the phosphor particles in this specification include not only the particles that generate fluorescence but also particles that generate phosphorescence. Note that the first light means light having a specific wavelength(s) or light in a specific band, and the first light may be composed of one type of light or a plurality of types of light. An example case in which the first light is composed of a plurality of types of light is one in which a light-emitting apparatus includes a semiconductor light-emitting element that emits blue light as the first light and a semiconductor light-emitting element that emits ultraviolet light as the first light. The second light means light that is emitted from the phosphor particles as at least a part of the first light becomes excitation light for the phosphor particles. The second light may also be composed of one type of light or a plurality of types of light. An example case in which the second light is composed of a plurality of types light is one in which a plurality of types of phosphor particles having different light-emission bands are dispersed in the same fluorescent member. Further, another example case is one in which phosphor particles having different light-emission bands are dispersed in different fluorescent members, respectively.

When a fluorescent member is used to obtain white light, for example, phosphor particles that emit red light by using blue light as the excitation light and phosphor particles that emit green light by using the blue light as the excitation light are contained in the fluorescent member. Further, it is assumed that the fluorescent member has a transmissive property by which the fluorescent member lets a part of the blue light, which is the excitation light, that has not contributed to the excitation pass therethrough. In this way, the part of the blue light that has passed through the fluorescent member is mixed with the red light and the green light emitted from the fluorescent member, so that white light is obtained.

Further, in another example, phosphor particles that emit blue light by using ultraviolet light or violet light as the excitation light, phosphor particles that emit red light by using the ultraviolet light or the violet light as the excitation light, and phosphor particles that emit green light by using the ultraviolet light or the violet light as the excitation light are contained in the fluorescent member. In this way, the blue light, the red light, and the green light emitted from the fluorescent member are mixed with each other. As a result, it is possible to obtain white light by the fluorescent member according to this embodiment. In this case, in addition to an embodiment which is designed so that a part of the excitation light passes through the fluorescent member, an embodiment which is designed so that the whole excitation light is absorbed by the fluorescent member may be adopted.

In the fluorescent member according to this embodiment, it is preferred that the phosphor particles be uniformly present (i.e., dispersed) throughout the fluorescent member in order to make the generated fluorescence uniform without causing unevenness and make the overall transmittance of the excitation light uniform without causing unevenness. In this way, the excitation light that has passed through the fluorescent member and the fluorescence generated from the fluorescent member are mixed with each other, so that the color of the light emitted from the fluorescent member can be easily adjusted. Alternatively, the distribution of the phosphor particles may have a concentration gradient, and a fluorescent member that contains different phosphor particles on a region-by-region basis may be used. Such a fluorescent member can be easily obtained by changing a process(es) in the manufacturing process. It is also possible to join different types of fluorescent members to each other.

A preferred example of the thickness of the fluorescent member may change depending on the use thereof, but may be, for example, 100 µm or larger. An optical film may be provided on at least one of the light-receiving surface side and the light-emitting surface side of the fluorescent member. For example, an antireflection film may be provided as the optical film.

According to the fluorescent member in accordance with this embodiment, it is possible to obtain a fluorescent member without requiring a high-temperature sintering process (a high-temperature process at a temperature higher than 250° C.) as described later. Therefore, it is possible to provide a fundamental solution to the problem related to the deterioration and the alteration of phosphor particles, and to significantly increase the types of usable phosphor particles. Further, the deterioration of phosphor particles can be prevented. As a result, it is possible to provide a fluorescent member for wavelength conversion having an excellent fluorescent property.

(Matrix)

In this specification, a matrix means a component(s) in a fluorescent member other than phosphor particles and components contained in very small amounts, i.e., in less than 1 mass %, and may also include additives that are arbitrarily added. Further, the main component(s) means a component(s) that is contained in 90 mass % or higher in the matrix. In this embodiment, magnesium oxide and magnesium hydroxide are the main components of the matrix. The ratio of magnesium oxide to magnesium hydroxide is not limited to any particular ratio. Examples of components other than the main components include sodium chloride (NaCl), zinc oxide (ZnO), barium titanate ($BaTiO_3$), and calcium carbonate ($CaCO_3$). Further, a dispersant may also be added.

The mass ratio of magnesium hydroxide to magnesium oxide ([Magnesium hydroxide]/[Magnesium oxide]) in the matrix of the fluorescent member according to this embodiment can be designed as appropriate according to the use. However, the mass ratio is preferably 0.4 or lower, more preferably 0.3 or lower, and still more preferably 0.25 or lower in order to effectively increase the thermal conductivity. The lower limit of the mass ratio of magnesium hydroxide to magnesium oxide is not limited to any particular ratio as long as the fluorescent member can be densified. However, the lower limit is preferably 0.1 or higher so that the densification process can be easily carried out at a low temperature.

The average particle diameter of the magnesium oxide in the matrix is not limited to any particular value, but is preferably 0.1 µm to 10 µm in view of the thermal conductivity. The average particle diameter of the magnesium oxide in the matrix is obtained by performing measurement as described below by using a linear-intercept method or like in conformity with ISO13383-1:2012. That is, after crystal particles on an observation surface are clarified by mirror-grinding the observation surface and performing plasma etching thereon, a photograph showing the texture of the crystal particles is obtained by using a scanning electron microscope. A straight line is drawn on the obtained photograph of the texture and a measured distance between intersection points of the straight line and a particle interface is used as a particle diameter. This measurement of a particle diameter is repeated, and an average of the obtained values is used as an average particle diameter of the magnesium oxide.

It should be noted that when a resin is used as a matrix of a fluorescent member, its thermal conductivity is around 0.1 W/(m·K), whereas when glass is used, the thermal conductivity is around 1 W/(m·K). In contrast, according to the fluorescent member in accordance with this embodiment in which a matrix containing magnesium oxide and magnesium hydroxide as main components is used, its thermal conductivity can be greatly improved. It is also easy to achieve a thermal conductivity of 5 W/(m·K) or higher by optimizing the manufacturing process for the fluorescent member.

The thermal conductivity of a fluorescent member according to this embodiment is preferably 5 W/(m·K) or higher, more preferably 6 W/(m·K) or higher, and still more preferably 8 W/(m·K) or higher in order to improve the thermal conductivity even further. The upper limit of the thermal conductivity is not limited to any particular value. However, in the case of a matrix containing magnesium oxide and magnesium hydroxide as main components, its thermal conductivity is theoretically 50 W/(m·K) or lower, so that it is possible to achieve a higher thermal conductivity by changing the process and thereby controlling the thermal conduction path. Note that the thermal conductivity in this specification means a thermal conductivity of a fluorescent member that is measured according to JIS R1611, in particular, a value that is measured by a method described below in an embodiment.

(Phosphor Particles)

According to this embodiment, it is possible to perform sintering at a room temperature without performing heating as described later, and therefore to use any type of phosphor particles. Examples of the phosphor include a β-sialon phosphor, a KSF-based phosphor ($K_2SiF_6$:Mn), CASN, S-CASN, a cerium-activated yttrium-aluminum-garnet (YAG)-based phosphor, a cerium-activated lutetium-aluminum-garnet (LAG)-based phosphor, a nitrogen-containing calcium aluminosilicate (CaO—$Al_2O_3$—$SiO_2$)-based phosphor activated by europium and/or chromium, and a europium-activated silicate (($Sr,Ba)_2SiO_4$)-based phosphor. Nitride phosphor particles are preferred in order to suppress the decrease in light-emission intensity due to the rise in temperature caused by laser excitation or the like. Examples of the nitride phosphor particles include an α-sialon phosphor, a β-sialon phosphor, CASN, S-CASN, and the like.

The phosphor particles are preferably nitride phosphor particles containing nitrogen in its phosphor composition. Specific examples the phosphor include a nitride phosphor containing strontium and silicon in a crystal phase (e.g., SCASN and $Sr_2Si_5N_8$), a nitride phosphor containing calcium and silicon in a crystal phase (e.g., SCASN, CASN, and CASON), a nitride phosphor containing strontium, silicon, and aluminum in a crystal phase (e.g., SCASN and $Sr_2Si_5N_8$), a nitride phosphor containing barium and silicon in a crystal phase (e.g., BSON), and a nitride phosphor containing calcium, silicon, and aluminum in a crystal phase (e.g., SCASN, CASN, and CASON).

As another aspect of the classification of nitride phosphors, examples include a lanthanum nitride silicate (e.g., LSN), an alkaline earth metal nitride silicate (e.g., $Sr_2Si_5N_8$), an alkaline earth metal nitride silicate (CASN, SCASN, α-Sialon, and (Ca,Sr)$AlSi_4N_7$), and the like.

More specifically, examples include phosphors such as:
β-sialon that can be expressed by the following general formula;

$Si_{6-z}Al_zO_zN_{8-z}$:Eu (where 0<z<4.2), α-sialon

LSN expressed by the following general formula; $Ln_xSi_6N_yM_z$ [1]

(In the Formula [1], Ln represents one or more elements selected from rare earth elements other than elements used as activating elements, and M represents one or more elements selected from the activating elements. Further, x, y and z are values each of which independently satisfies the following formula.

2.7≤x≤3.3, 10≤y≤12, 0<z≤1.0)

CASN expressed by the following general formula; $CaAlSiN_3$:Eu,

SCASN that can be expressed by the following general formula; (Ca,Sr,Ba,Mg)$AlSiN_3$:Eu and/or (Ca,Sr,Ba) AlSi(N,O)$_3$:Eu, CASON that can be expressed by the following general formula; $(CaAlSiN_3)_{1-x}(Si_2N_2O)_x$:Eu (0<x<0.5), $CaAlSi_4N_7$ that can be expressed by the following general formula; Euy(Sr,Ca,Ba)$_{1-y}$:$Al_{1+x}Si_{4-x}O_xN_{7-x}$ (where 0≤x<4, 0≤y<0.2.);

$Sr_2Si_5N_8$ that can be expressed by the following general formula; $(Sr,Ca,Ba)_2Al_xSi_{5-x}O_xN_{8-x}$:Eu (where 0≤x≤2), and BSON that can be expressed by the following general formula; $M_xBa_y(Sr,Ca,Mg,Zn)_zL_6O_{12}N_2$ (where M represents an activating element selected from Cr, Mn, Fe and lanthanoids (except for La, Pm, Gd and Lu), and L represents a metal element belonging to Group 4 or Group 14 in the periodic table and containing Si. Further, x, y and z are values each of which independently satisfies the following formula.

0.03≤x≤0.9, 0.9≤y≤2.95, x+y+z=3).

Among these phosphors, it is preferable to use a nitride phosphor containing no oxygen as a constituent element (including oxygen that is inevitably contained), i.e., a nitride phosphor such as LSN, $CaAlSiN_3$, SCASN, $Sr_2Si_5N_8$, β-sialon, BSON, and the like in order to prevent the luminance from being lowered when sintering is carried out.

The type of phosphor particles to be added is not limited to any particular type, and a plurality of types of phosphor particles may be added according to the purpose.

The content of phosphor particles in the fluorescent member can be adjusted as appropriate according to the shape (the thickness and the like), the required transparency (the overall transmittance of the excitation light), and the fluorescent property (a fluorescence intensity and a light-emission wavelength) of the fluorescent member.

The average particle diameter of phosphor particles in the matrix is not limited to any particular value. However, the average particle diameter is preferably 500 nm to 30 μm, and more preferably 1 μm to 10 μm in order to obtain a transmissive property of excitation light, an excellent fluorescent characteristic, and an excellent dispersibility in a balanced manner. The average particle diameter of phosphor particles in the matrix is obtained by using a linear-intercept method in conformity with ISO13383-1:2012. The specific measuring method is similar to that for the magnesium oxide.

[Method for Manufacturing Fluorescent Member]

Next, an example of a method for manufacturing a fluorescent member according to this embodiment will be described. However, the method for manufacturing a fluorescent member according to the present invention is not limited to the below-described method.

The method for manufacturing a fluorescent member according to this embodiment includes the steps of: obtaining a mixture by mixing at least phosphor particles and a raw-material powder of a matrix; preforming the mixture into a preform; and obtaining a sintered body by impregnating the preform with water and then performing a sintering process under pressure. According to the manufacturing method in accordance with this embodiment, it is possible to manufacture a fluorescent member having both an excellent thermal conductivity and an excellent fluorescent property without requiring a high-temperature process at a temperature higher than 250° C.

The sintering in this specification means a phenomenon in which the surface area of a powder decreases, and means a method for obtaining a preform and fixing the preform into a fluorescent member at a temperature of 250° C. or lower under pressure in a sintering process which is performed after the preform is impregnated with water (hereinafter also referred to as "low-temperature sintering"). It is synonymous with the so-called cold sintering. By performing the low-temperature sintering, as will be described later, water (a liquid phase) with which the preform is impregnated is introduced to particle-particle interfaces, so that particles are uniformly swollen with an appropriate amount of water. Further, under the pressurized condition, the mass diffusion through the liquid phase is promoted, so that densified bulk ceramics in which magnesium hydroxide is generated through the reaction between a part of magnesium oxide and water is obtained. Note that the lower limit of the sintering temperature is not limited to any particular temperature, but is preferably a room temperature. It should be noted that the preforming in this specification means a molding process from an amorphous state such as a granular state to a solid state having a fixed shape through, for example, pressurization, and means a preform that has not yet been impregnated with water. Note that the process for forming a preform may be carried out at a temperature higher than 250° C. Further, in the step of obtaining a preform, particles are in point-contact with each other and hence the surface area does not greatly change. Therefore, the term "sintering" in this specification means a process that is performed after the impregnation with water, and does not include the process for forming a preform. The manufacturing method will be described hereinafter in detail.

Firstly, a raw-material powder and phosphor particles are weighed and mixed. The average particle diameter calculated from the specific surface area S and the density ρ of the magnesium oxide of the raw-material powder by using a formula $6/(S \cdot \rho)$ is preferably 20 to 1,000 nm, more preferably 30 to 800 nm, and still more preferably 40 to 700 nm. Note that the specific surface area was measured according to ISO9277. By adjusting the average particle diameter of the magnesium oxide of the raw-material powder to a value within the range of 20 to 1,000 nm, it is possible to achieve both an excellent thermal conductivity and an excellent mechanical characteristic. As the raw-material powder of the matrix, a plurality of types of magnesium oxides having different average particle diameters may be used in order to effectively promote the densification property. For example, the densification property may be increased by using second particles that have a relatively small size and fill gaps formed between first particles.

The average particle diameter of the phosphor particles used as the raw material is not limited to any particular value as long as it does not deviate from the object of the present invention. However, the average particle diameter is preferably 500 nm to 30 μm, and more preferably 1 μm to 10 μm in order to obtain a satisfactory light-transmissive property, a satisfactory dispersibility, and a satisfactory fluorescent property in a balanced manner. Note that the average particle diameter of the raw-material powder of the phosphor particles according to this embodiment is calculated from the specific surface area and the density.

The mixing ratio of the raw-material powder and the phosphor particles, of which the matrix is formed, is not limited to any particular value, and is adjusted as appropriate according to the desired transparency and the desired fluorescent property of a fluorescent member to be manufactured. When the content of the raw-material powder for forming the matrix is defined as 100 vol %, the content of the phosphor particles is, for example, 0.1 to 30 vol %, preferably 0.5 to 20 vol %, more preferably 1 to 15 vol % in view of the densification property. The overall transmittance of the fluorescent member for the excitation light is preferably, for example, 10% or higher in the optical-path direction.

The raw-material powder and the phosphor particles of the matrix may be subjected to a pulverizing process or/and a cracking process independently of each other before being mixed. The raw-material powder and at least one type of phosphor particles for the matrix are weighed so that they have a predetermined molar ratio. An additive(s) may be added as long as it does not hinder the formation of the matrix of the fluorescent member. Examples of the additive include magnesium chloride, hydrochloric acid, acetic acid, ammonia, and the like. By using at least magnesium oxide as the raw-material powder, and implementing a preform containing the magnesium oxide and phosphor particles with water and then sintering the preform at a low temperature, magnesium hydroxide is obtained through the reaction between the magnesium oxide with the water.

The method for obtaining the mixture is not limited to any particular method, and the mixture may be obtained, for example, through a dry process or/and a wet process. In the case of the dry process, for example, there is a method in which raw materials are put and mixed in a mortar. In this process, a dispersant may be added. In order to make the particle sizes of the powder of the mixture uniform, a mixture having a predetermined particle diameter may be obtained by using two or more sieves having different mesh sizes in a stepwise manner.

The preform can be formed after the mixture is obtained or simultaneously with the step for obtaining the mixture. In the case of the wet mixing, it is also possible to obtain a preform simultaneously with the mixture by preparing a slurry, in which raw materials are mixed with solvent (ethanol or the like), using a ball mill or the like, and then removing the solvent. In this case, it is also possible to perform preforming by using a pressure or the like. As the preforming method, any existing preforming method can be used without limitation. For example, a preform may be obtained by charging a mixture into a mold and applying a pressure to the changed mixture. The pressurization may be isotropic pressurization or anisotropic pressurization (e.g., pressurization in a uniaxial direction). Further, the mixture may be heated. In order to prevent the phosphor particles from deteriorating, when the mixture is heated, the heating temperature is preferably 250° C. or lower. Further, in order to simplify the apparatus, the heating is preferably performed through cold isostatic pressing at a room temperature. In order to obtain a high-quality fluorescent member, it is preferable to pressurize the preform so that the internal structure thereof is made uniform at the stage of the preform. In order to make the internal structure uniform, the process conditions (the pressurization condition and the like) for the aggregate cracking of the raw-material powder and for the preform are important.

As an example of the preforming, there is an example method in which: a pre-molded body is obtained by performing uniaxial pressure molding at a pressure of 50 MPa for 30 seconds; the pre-molded body is chamfered and then bagged into a vacuum pack; and a preform is obtained by performing cold isostatic pressing (CIP: Cold Isostatic Pressing) molding at a pressure of 200 MPa for one minute once or a plurality of times. In order to make the internal structure of the preform uniform, the maximum pressure in the preforming is preferably 5 to 1,000 MPa, more preferably 200 to 1,000 MPa, and still more preferably 500 to 1,000 MPa.

Next, the preform is impregnated with water. The water may contain an additive(s) as long as it does not impair the object of the present invention, and may be neutral, acidic, or alkaline. The water may be added at an atmospheric pressure, or may be added in a vacuum or at a reduced pressure. By adding the water in a vacuum or at a reduced pressure, the water can be uniformly distributed (or spread) in a short time. It is particularly effective when the preform is thick.

The amount of added water should be such an amount that gaps in the preform is filled with the water, and the optimum amount of water may change according to the relative density of the preform. The mass transfer can also be promoted by adjusting the process temperature of the low-temperature sintering which is performed in the next step, so that the optimum amount of the added water may also change according to the process temperature. The amount of water necessary to achieve the densification of the fluorescent member may be defined as the upper limit thereof. For example, when the mass of the preform is defined as 100 mass %, the amount of added water can be, for example, 1 to 20 mass %.

After the preform is impregnated with water, the preform is sintered at a low temperature under pressure, so that a sintered body is obtained. Magnesium ions of the magnesium oxide in the preform are dissolved by the impregnation with water, and the mass transfer of the magnesium ions is promoted through the liquid phase under pressure, so that the dissolved ions are precipitated as magnesium hydroxide or magnesium oxide. As a result, the fluorescent member can be densified. Therefore, a sufficient pressure to promote the mass transfer through the liquid phase is required. In order to achieve sufficient densification, the maximum pressure is preferably 200 to 1,500 MPa, more preferably 300 to 1,200 MPa, and still more preferably 500 to 1,000 MPa. It is possible, by adjusting the pressure to 200 to 1,500 MPa, to promote the dissolution of particles constituting the matrix part in the liquid phase and the precipitation thereof from the liquid phase without performing high-temperature sintering and to promote the high densification resulting from the plastic deformation. As means for applying a pressure, a known method can be applied. Pressurization by isostatic pressing is particularly preferred because it enables isotropic pressurization. The pressurization time changes according to the mechanism and the pressure of the chemical reaction that contributes to the densification, but is preferably 1 to 60 minutes.

In the case where the sintering is performed at a room temperature, as an example of the method for obtaining a sintered body, there is a method in which a sintered body is obtained by, after impregnating a preform with water, bagging the preform in a vacuum pack, and performing CIP molding, for example, at a pressure of 1,000 MPa for 60 minutes once or a plurality of times by using a cold isostatic pressing apparatus. Further, in the case where the preform is heated, it is possible to mold a sintered body by using a WIP warm isostatic pressing (WIP: Warm Isostatic Pressing) apparatus.

In view of the thermal conductivity, the ratio of magnesium oxide to magnesium hydroxide is preferably adjusted so that the amount of the former is larger than the latter. Further, in view of the densification of the fluorescent member, it is preferable to add a large amount of water and thereby to generate magnesium hydroxide through the reaction between the magnesium oxide and the water. Since the densification of the fluorescent member can be promoted by heating, the densification may be promoted by performing a high-temperature process at a temperature of 250° C. or lower. In order to reduce the energy consumption and to simplify the apparatus, it is desirable to perform low-temperature sintering at a room temperature.

Note that the above-described manufacturing method is merely an example, and a fluorescent member according to this embodiment can be manufactured by various manufacturing methods. For example, a fluorescent member may be obtained by obtaining a mixture of phosphor particles, a raw-material powder containing at least magnesium oxide, and ice particles, preforming the mixture into a preform at a temperature below the freezing point, and then performing the above-described low-temperature sintering, or performing the above-described low-temperature sintering without preforming the preforming. Further, it is also possible to obtain a fluorescent member by combining a freeze-drying method and low-temperature sintering. Specifically, as an example of the method for obtaining a fluorescent member can be, there is a method in which a fluorescent member is obtained by obtaining a mixture of phosphor particles, a raw-material powder containing at least magnesium oxide, and water and a solvent having a sublimation point lower than that of water (methanol or the like), forming droplets by spraying the mixture using a spray through a freeze-drying method, obtaining granules from which the solvent is removed and in which water remains, and performing the above-described low-temperature sintering for the granules.

The relative density of the fluorescent member is preferably 85% or higher in order to effectively increasing the light-emitting efficiency. Note that the relative density means a value (expressed by mass ratio) that is obtained by dividing the density of a fluorescent member measured according to an Archimedes method in conformity with JIS Z2501:2000 by the true density of a raw-material powder of a matrix component (excluding phosphor particles). The range of the relative density of the fluorescent member is more preferably 88% or higher, and still more preferably 90% or higher.

According to this embodiment, it is possible to provide a highly-densified fluorescent member containing phosphor particles by promoting the solid-liquid reaction that promotes the mass transfer in the solid through the liquid phase without performing high-temperature sintering. Because of the densification, it is possible to reduce pores and thereby to provide a fluorescent member having an excellent light-transmissive property. In addition, it is possible to achieve a high thermal conductivity by using magnesium oxide as a matrix component. Further, since the method does not require high-temperature sintering higher than 250° C., various types of phosphor particles can be used. As a result, it is possible to fundamentally solve the problem in the related art such as the degradation and the alteration of phosphor particles caused by high-temperature sintering and the undesired reaction between phosphor particles and the matrix part, and to enable material design with a higher degree of freedom. As a result, it is possible to provide a high-quality fluorescent member. Further, it is possible to provide a fluorescent member having both a high thermal conductivity and a satisfactory fluorescent property. It is expected that a fluorescent member according to this embodiment can be widely applied not only to high-power LEDs and the like but also to various types of members.

[Light-Emitting Apparatus]

A light-emitting apparatus according to this embodiment includes a semiconductor light-emitting element that emits first light, and a fluorescent member according to this embodiment that is disposed on the emitted-light side of the semiconductor light-emitting element and emits second light by using the first light as excitation light. In the light-emitting apparatus, at least one or a plurality of semiconductor light-emitting elements and at least one or a plurality of fluorescent members are included independently of each other.

FIG. 1 is a schematic diagram of a white LED as an example of the light-emitting apparatus according to this embodiment. In the white LED 10, a blue LED 2 is provided on a substrate 1 as a primary light source, and a fluorescent member 5 is disposed in at least a part of an optical path of light emitted from the blue LED 2. The fluorescent member 5 may be formed in an arbitrary shape according to the shape of the blue LED 2. A part of the light emitted from the blue LED 2 excites phosphor particles 4, which are, for example, yellow phosphor particles, dispersed in a matrix 3 of the fluorescent member 5, so that they emit yellow light. Further, a part of the light emitted from the blue LED 2 that has not contributed to the excitation of the phosphor particles in the fluorescent member passes through the fluorescent member 5 and is emitted from the white LED 10 as blue light. As a plurality of emitted lights are mixed with each other, white light is generated from the white LED 10.

Note that the example shown in FIG. 1 is merely an example, and the fluorescent member may be used to improve the quality of the color of white light by using a red LED or/and a green LED instead of or in combination with the blue LED. Further, the yellow phosphor particles are merely an example, and red phosphor particles or/and green phosphor particles can be used instead of or in combination with the yellow phosphor particles. Needless to say, phosphor particles for other colors may be used. Further, needless to say, a semiconductor light-emitting element such as a laser diode may be used instead of the LED.

In the case of the white LED 10, in order to optimize the amount of the blue light that is emitted from the blue LED 2 and passes through the fluorescent member 5, and the amount of the light having a different wavelength(s) (green light, red light, etc.) that is emitted from the phosphor particles of the fluorescent member 5 as they absorb the blue light, the thickness of the fluorescent member 5 and the concentration of the phosphor particles in the fluorescent member 5 are designed as appropriate. The excitation light from the blue LED is, for example, light having a wavelength(s) of 300 nm to 500 nm (light in an ultraviolet range to light in a blue range).

Figure 2:
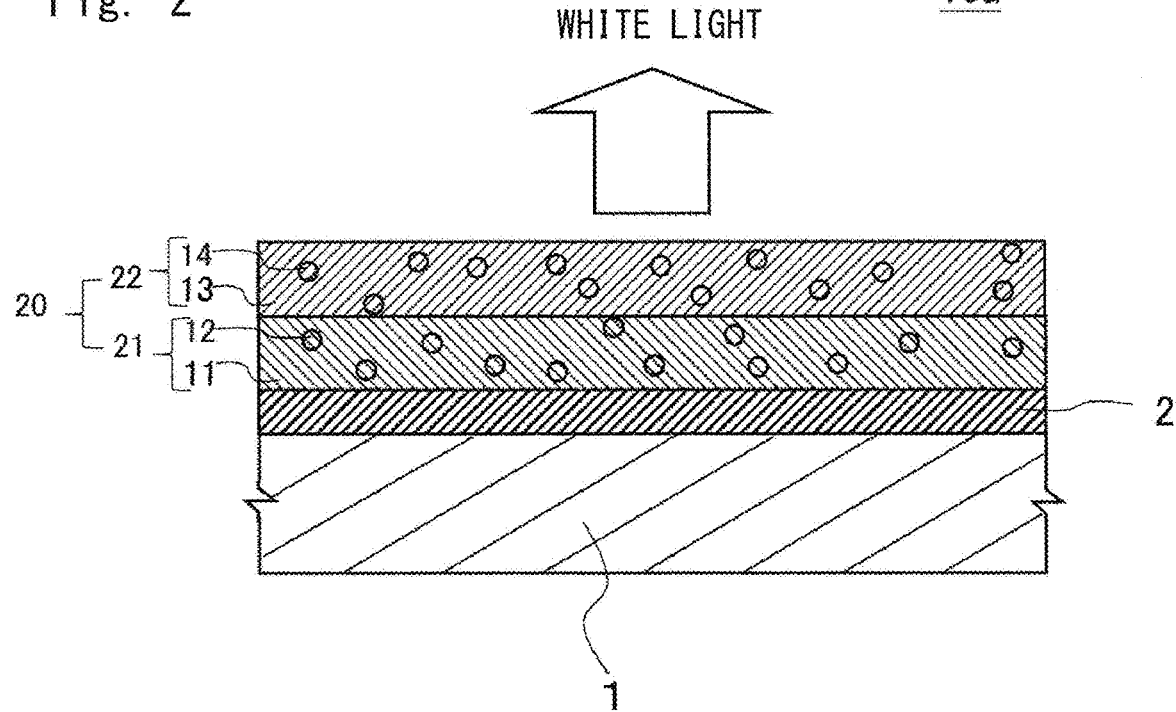
FIG. 2 is a schematic cross-sectional diagram showing an example of a light-emitting apparatus according to a modified example.

Instead of using the fluorescent member 5 of the white LED 10 shown in FIG. 1, as shown in FIG. 2, a white LED 10a formed by using a fluorescent member 20 composed of a first fluorescent member 21 and a second fluorescent member 22 may be used. In the first fluorescent member 21, first phosphor particles 12 that absorb first light emitted from the blue LED 2 and emit light are contained in a first matrix 11. Meanwhile, in the second fluorescent member 22, second phosphor particles 14 that absorb the light emitted from the first fluorescent member 21 and emit light of a longer wavelength(s) are contained in a second matrix 13. By using the fluorescent member 20, in which the first fluorescent member 21 is joined to the second fluorescent member 22, it is possible to emit light of the longer wavelength(s) by using a part of the light emitted from the fluorescent member 20 as second excitation light. By the above-described configuration, it is also possible to adjust the color of the white color.

EXAMPLE

The present invention will be described hereinafter in a more detailed manner by using examples. However, the present invention is not limited to the below-described embodiments.

[Experiment Example A] (Densification of Matrix Part)

A mixture of matrix powders was obtained by weighing DISPERMAG (Registered Trademark) TN-1 (average particle diameter 0.57 µm, manufactured by Tateho Chemical Industries Co., Ltd.) and PUREMAG (Registered Trademark) FNM-G (average particle diameter 0.54 µm, manufactured by Tateho Chemical Industries Co., Ltd.) as raw material MgO powders so that their mass ratio became 7:3, and mixing them by using a mixer. A pre-molded body was obtained by charging 1 g of this mixture of the matrix powders into a cylindrical stainless steel mold having a diameter of 15 mm, and performing primary molding at 50 MPa for 30 seconds by using a uniaxial pressure molding machine (Product name: Hydraulic Shop Press, manufactured by Woodward Fab).

Next, a preform was obtained by applying an isostatic pressure of 1,000 MPa at a room temperature for one minute. The relative density of the preform was 65%. The preform was impregnated with 10 mass % of water under a reduced pressure (−0.05 MPa). After that, a cylindrical sintered body was obtained by applying an isostatic pressure of 1,000 MPa at a room temperature for 60 min by using a cold isostatic pressing apparatus (Product name: Dr. CHEF, manufactured by Kobe Steel Ltd.), and thereby performing low-temperature sintering. The relative density was 96%.

Comparative Example 1

A sintered body was obtained by a method similar to that for the Experiment Example A except that the step for the impregnation with water was not performed. The relative density of the preform was 66%, and the relative density of the sintered body was 66%.

Example 1a

A red phosphor (CASN manufactured Sialon Co., Ltd.) was further added as phosphor particles in the mixture of the matrix powders of the Experiment Example A. A phosphor particle-containing mixture was obtained by sufficiently mixing the raw-material powder and the phosphor particles in a mortar so that their volume ratio became 99:1. A preform was formed by charging 1 g of this phosphor particle-containing mixture into a mold in a manner similar to that for the Experiment Example A and performing similar processes under similar conditions to those in the Experiment Example A, and then a fluorescent member, which was a sintered body, was obtained therefrom. The relative density of the preform was 65%, and the relative density of the fluorescent member was 92%.

Example 1b

A fluorescent member according to an Example 1b was obtained by a method similar to that for the Example 1a except that the volume ratio expressed as [matrix]:[phosphor particles] was changed to 9:1. The relative density of the preform was 65%, and the relative density of the fluorescent member was 88%.

Example 1c

A fluorescent member according to an Example 1c was obtained by a method similar to that for the Example 1a except that the volume ratio expressed as [matrix]:[phosphor particles] was changed to 8:2.

Comparative Example 2

A fluorescent member according to a Comparative Example 2 was obtained in a manner similar to that for the Example 1b except that the preform was sintered at 1,300° C. for one hour in the atmosphere instead of performing the step for the impregnation with water and the low-temperature sintering step. The relative density of the preform was 66%, and the relative density of the fluorescent member was 69%.

Example 2b

A phosphor particle-containing mixture was obtained by mixing, as phosphor particles, an orange phosphor (α-SiAlON manufactured by Sialon Co., Ltd.) with the mixture of the Experiment Example A in a mortar so that the volume ratio expressed as [matrix]:[phosphor particles] became 9:1. A preform was formed by charging 1 g of this mixture in a mold in a manner similar to that for the Experiment Example A and performing similar processes under similar conditions to those in the Experiment Example A, and then a fluorescent member, which was a sintered body, was obtained therefrom. The relative density of the preform was 67%, and the relative density of the fluorescent member was 92%.

Examples 2a and 2c

Fluorescent members according to Examples 2a and 2c were obtained by a method similar to that for the Example 2b except that the volume ratios expressed as [matrix]:[phosphor particles] were changed to the numerical values shown in a Table 1.

Example 3a

A phosphor particle-containing mixture was obtained by mixing, as phosphor particles, a green phosphor (β-SiAlON manufactured by Sialon Co., Ltd.) with the mixture of the Experiment Example A in a mortar so that the volume ratio expressed as [matrix]:[phosphor particles] became 99:1. A preform was formed by charging 1 g of this mixture in a mold in a manner similar to that for the Experiment Example A and performing similar processes under similar conditions to those in the Experiment Example A, and then a fluorescent member, which was a sintered body, was obtained therefrom.

Examples 3b and 3c

Fluorescent members according to Examples 3b and 3c were obtained by a method similar to that for the Example 3a except that the volume ratios expressed as [matrix]:[phosphor particles] were changed to the numerical values shown in the Table 1.

[Experiment Example B] (Densification of Matrix Part)

A mixture of matrix powders was obtained by weighing RF-10CS (average particle diameter 4 to 10 μm) and 500A (average particle diameter 45 to 60 nm), both of which were manufactured by Ube Material Industries, Ltd., as raw material MgO powders so that their mass ratio became 7:3, and sufficiently mixing them by using a mixer. A pre-molded body was obtained by charging 1 g of this mixture of the matrix powders into a mold and performing a method similar to that for the Experiment Example A. Next, a preform was obtained by applying an isostatic pressure of 200 MPa at a room temperature for one minute in order to make the internal structure uniform. The relative density of the preform was 67%. The preform was impregnated with 10 mass % of water in a manner similar to that for the Experiment Example A. After that, a cylindrical sintered body was obtained by a method similar to that for the Experiment Example A. The relative density of the sintered body of the Experiment Example B was 91%.

Example 4a

A red phosphor (CASN manufactured Sialon Co., Ltd.) was further added as phosphor particles in the mixture of the Experiment Example B. A phosphor particle-containing mixture was obtained by sufficiently mixing the raw-material powder and the phosphor particles in a mortar so that their volume ratio became 99:1. A preform and a fluorescent member, which was a sintered body, were obtained by charging 1 g of this phosphor particle-containing mixture in a mold in a manner similar to that for the Experiment Example B and performing a method similar to that for the Experiment Example B. The relative density of the preform was 66%, and the relative density of the fluorescent member was 87%.

Example 4b

A fluorescent member according to an Example 4b was obtained by a method similar to that for the Example 4a except that the volume ratio expressed as [matrix]:[phosphor particles] was changed to 9:1. The relative density of the preform was 67%, and the relative density of the fluorescent member was 88%.

[Experiment Example C] (Densification of Matrix Part)

A mixture of matrix powders was obtained by weighing RF-10CS manufactured by Ube Material Industries, Ltd. (average particle diameter 4 to 10 μm) and DISPERMAG (Registered Trademark) TN-1 (average particle diameter 0.57 μm, manufactured by Tateho Chemical Industries Co., Ltd.) as raw material MgO powders so that their mass ratio became 5:5, and sufficiently mixing them by using a mixer. A pre-molded body was obtained by charging 1 g of this mixture of the matrix powders into a mold and by performing a method similar to that for the Experiment Example A. Next, a preform was obtained by applying an isostatic pressure of 1,000 MPa at a room temperature for one minute in order to make the internal structure uniform. The relative density of the preform was 73%. The preform was impregnated with 10 mass % of water in a manner similar to that for the Experiment Example A. After that, a cylindrical sintered body was obtained by a method similar to that for the Experiment Example A.

Example 5a

A red phosphor (CASN manufactured Sialon Co., Ltd.) was further added as phosphor particles in the mixture of the Experiment Example C. A phosphor particle-containing mixture was obtained by sufficiently mixing the raw-material powder and the phosphor particles in a mortar so that their volume ratio became 9:1. A preform and a fluorescent member, which was a sintered body, were obtained by charging 1 g of this phosphor particle-containing mixture in a mold in a manner similar to that for the Experiment Example C and performing a method similar to that for the Experiment Example C.

[Experiment Example D] (Densification of Matrix Part)

A pre-molded body was obtained by charging 1 g of 500A manufactured by Ube Material Industries, Ltd. (average particle diameter 45 to 60 nm) as a raw material MgO powder into a mold and performing a method similar to that for the Experiment Example A. Next, a preform was obtained by applying an isostatic pressure of 200 MPa at a room temperature for one minute in order to make the internal structure uniform. The relative density of the preform was 49%. The preform was impregnated with 10 mass % of water in a manner similar to that for the Experiment Example A. After that, a cylindrical sintered body was obtained by a method similar to that for the Experiment Example A. The relative density of the sintered body of the Experiment Example D was 85%.

Example 6a

A red phosphor (CASN manufactured Sialon Co., Ltd.) was further added as phosphor particles in the mixture of the Experiment Example D. A phosphor particle-containing mixture was obtained by sufficiently mixing the raw-material powder and the phosphor particles in a mortar so that their volume ratio became 99:1. A preform and a fluorescent member, which was a sintered body, were obtained by charging 1 g of this phosphor particle-containing mixture in a mold in a manner similar to that for the Experiment Example D and performing a method similar to that for the Experiment Example D. The relative density of the preform was 47%, and the relative density of the fluorescent member was 80%.

Example 6b

A fluorescent member according to an Example 6b was obtained by a method similar to that for the Example 6a except that the volume ratio expressed as [matrix]:[phosphor particles] was changed to 9:1. The relative density of the preform was 50%, and the relative density of the fluorescent member was 84%.

Comparative Example 3

An epoxy resin was used as a matrix instead of using the raw-material powder of the matrix in the Example 1a, i.e., instead of using the MgO powder. A phosphor particle-containing mixture was obtained by adding the same amount (an amount by which the content of the phosphor particles becomes 1 vol % based on the total amount of the phosphor particle-containing mixture) of the same phosphor particles as those in the Example 1a in the aforementioned epoxy resin and sufficiently mixing them. Then, a fluorescent member of a Comparative Example 3 having the same shape as that in the Example 1a was obtained by melting and kneading the obtained phosphor particle-containing mixture.

Comparative Example 4

An epoxy resin was used as a matrix instead of using the raw-material powder of the matrix in the Example 1b, i.e., instead of using the MgO powder. A fluorescent member of a Comparative Example 4 having the same shape as that in the Example 1b was obtained by adding the same amount of the same phosphor particles as those in the Example 1b with the aforementioned epoxy resin and performing a method similar to that for the Comparative Example 3.

(SEM Image)

Figure 3A:
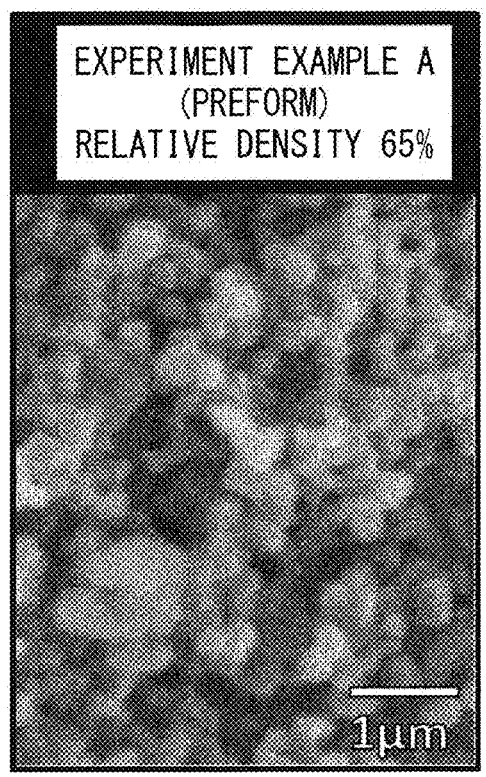
FIG. 3A is an SEM image of a preform of an Experiment Example A.
Figure 3B:
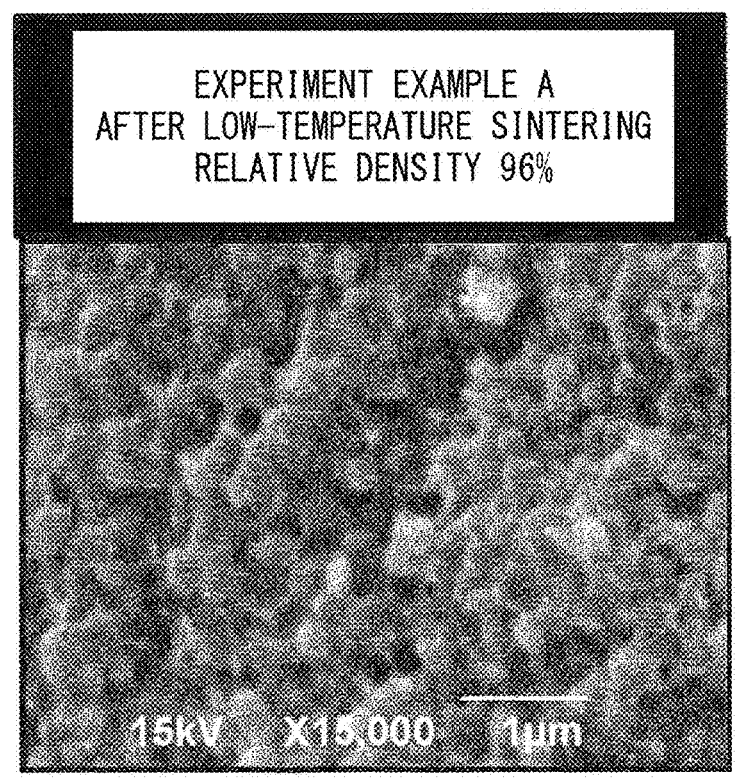
FIG. 3B is an SEM image of a sintered body of the Experiment Example A.

Samples for observations by a scanning electron microscope (SEM) were manufactured by mirror-grinding observation surfaces of the preform of the Experiment Example A, and the sintered bodies of the Experiment Example A and the Comparative Example 1 (i.e., the same sintered bodies as the fluorescent members of the examples except that they contained no phosphor particles) and performing plasma etching thereon, and thereby clarifying crystal particles on the observation surfaces. Then, the fractured surfaces were observed by using a scanning electron microscope (SEM, Product name: JSM-6390LV, manufactured by JEOL Ltd.). FIG. 3A shows an SEM image of the preform, and FIG. 3B shows an SEM image of the sintered body of the Experiment Example A after the low-temperature sintering step. Further, FIG. 3C shows an SEM image of the Comparative Example 1 (the sintered body after the low-temperature sintering step for which the step for the impregnation with water was not performed).

Figure 3C:
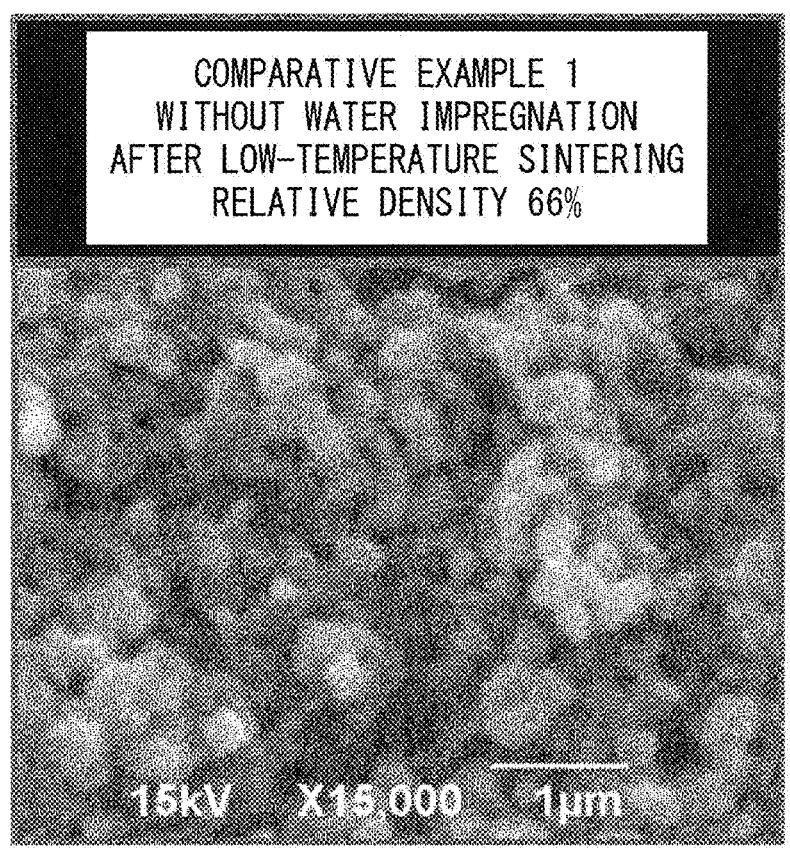
FIG. 3C is an SEM image of a sintered body of a Comparative Example 1.

The SEM image shown in FIG. 3C for which the step for the impregnation with water was not performed shows a structure similar to that of the preform shown in FIG. 3A, and therefore no change in microstructure caused by the low-temperature sintering was observed. Further, as described above, while the relative density of the preform was 65%, the relative density of the sample of the Comparative Example 1, in which the impregnation with water was not performed, was 66%. Therefore, it was confirmed that substantially no change occurred. Meanwhile, the relative density of the sintered body of the Experiment Example A, in which the step for the impregnation with water was performed, was 96%, and as shown in FIG. 3B, it was confirmed that the structure of the preform was more densified. Further, no growth of grains was observed.

Figure 4:
FIG. 4 is an SEM image of a fluorescent member of an Example 1 b.

FIG. 4 shows an SEM image of the fluorescent member of the Example 1b. Since the sintered body was formed by using the mixture containing 10 vol % of phosphor fine particles, its relative density decreased as compared to the sintered body of the Experiment Example A (the sample that was manufactured under the same conditions as those for the fluorescent member of the Example 1b except that it contained no phosphor particles). However, it was confirmed that the sintered body that was as dense as that of the Experiment Example A in a visual check could be obtained by using the fluorescent member of the Example 1b.

(X-ray Structural Analysis)

Figure 5:
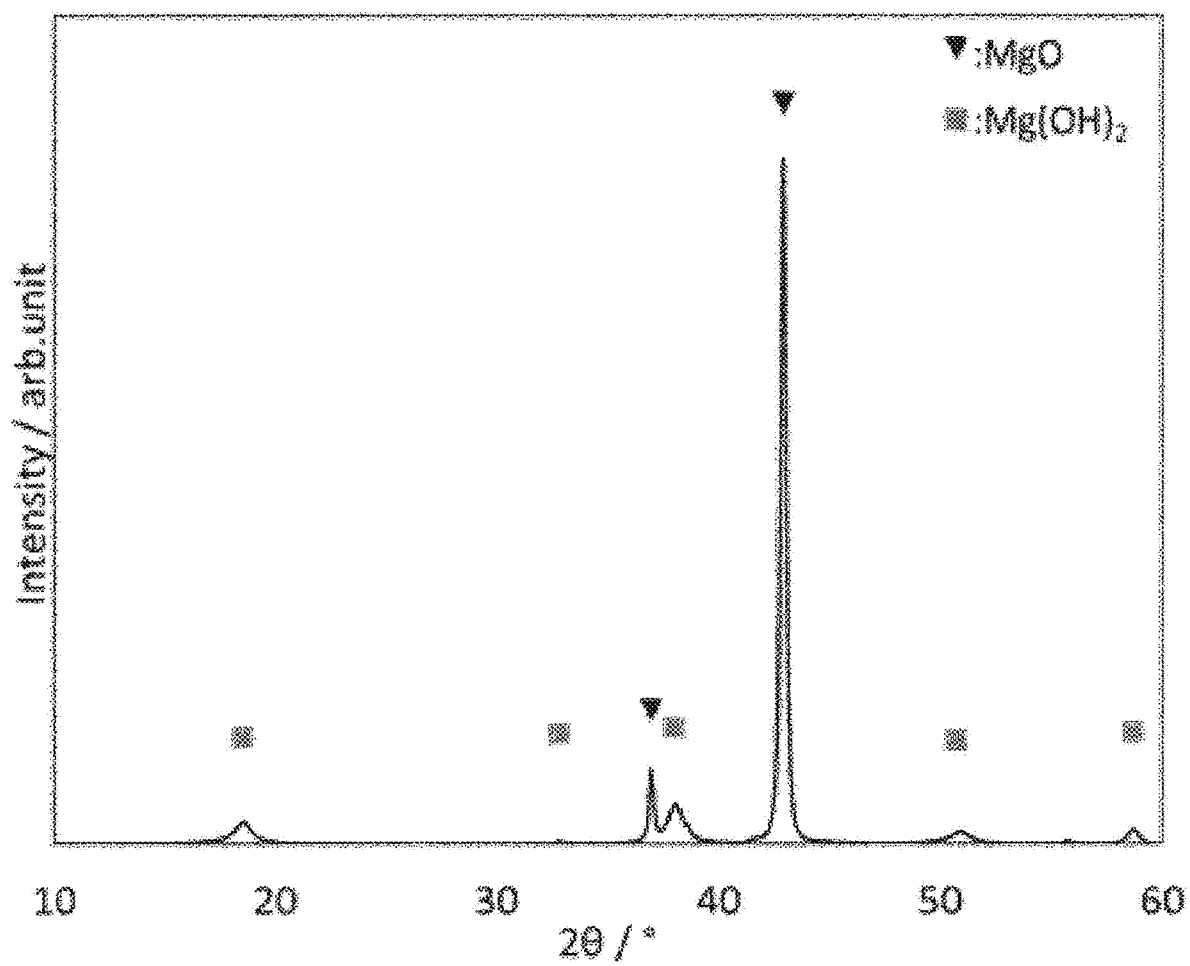
FIG. 5 shows an X-ray profile of a sintered body of an Experiment A.

FIG. 5 shows a result of an X-ray structure analysis made for the fluorescent member of the Experiment Example A.

Measurement was carried out for a sample for the X-ray structure analysis in a 2θ/θ mode by using a sample-horizontal-type multi-purpose X-ray diffraction apparatus Ultima IV manufactured by Rigaku Corporation. As shown in FIG. 5, in the sintered body of the Experiment Example A, a characteristic peak of magnesium oxide (this peak in FIG. 5 is indicated by a black triangle mark) and a characteristic peak of magnesium hydroxide (this peak in FIG. 5 is indicated by a black square mark) were observed, and therefore it was confirmed that magnesium oxide and magnesium hydroxide were contained as the matrix of the fluorescent member.

(Measurement of Emission Spectrum)

Figure 6:
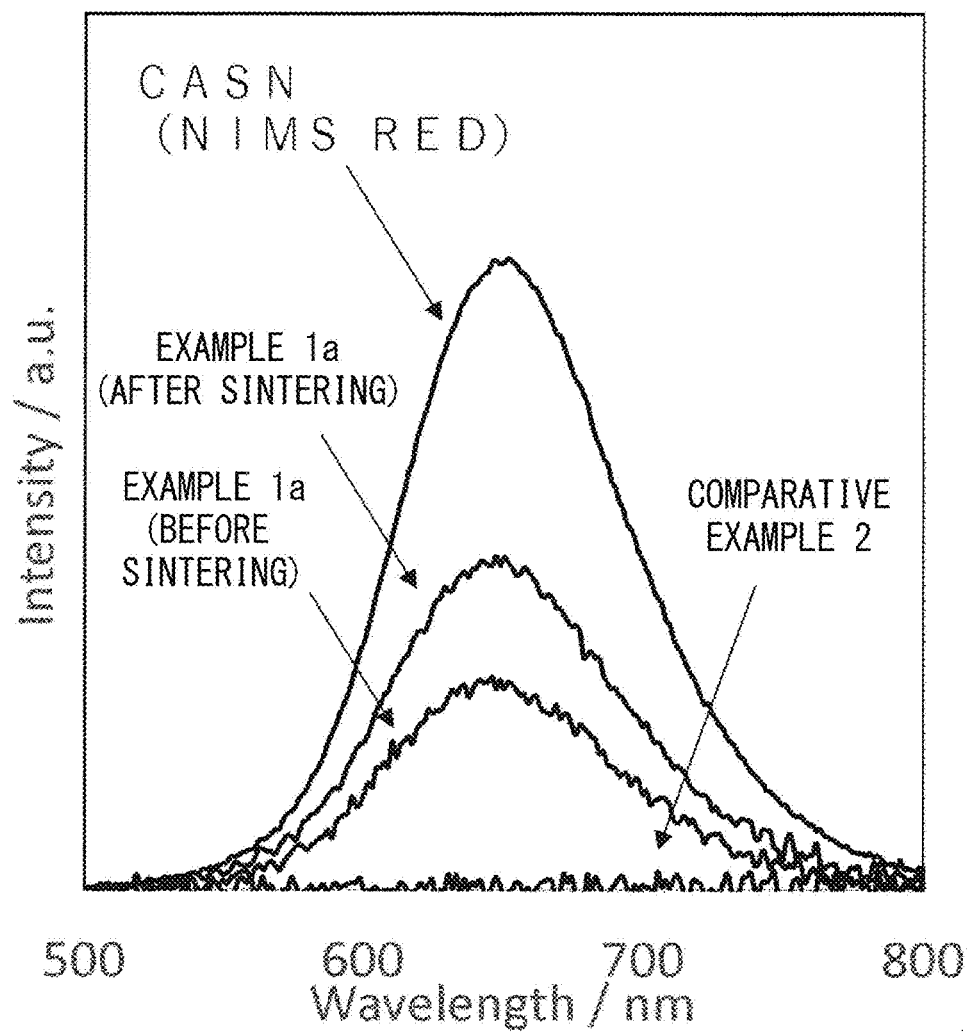
FIG. 6 shows fluorescence spectrums of the fluorescent member of the Example 1a and that of a Comparative Example 2.
Figure 7:
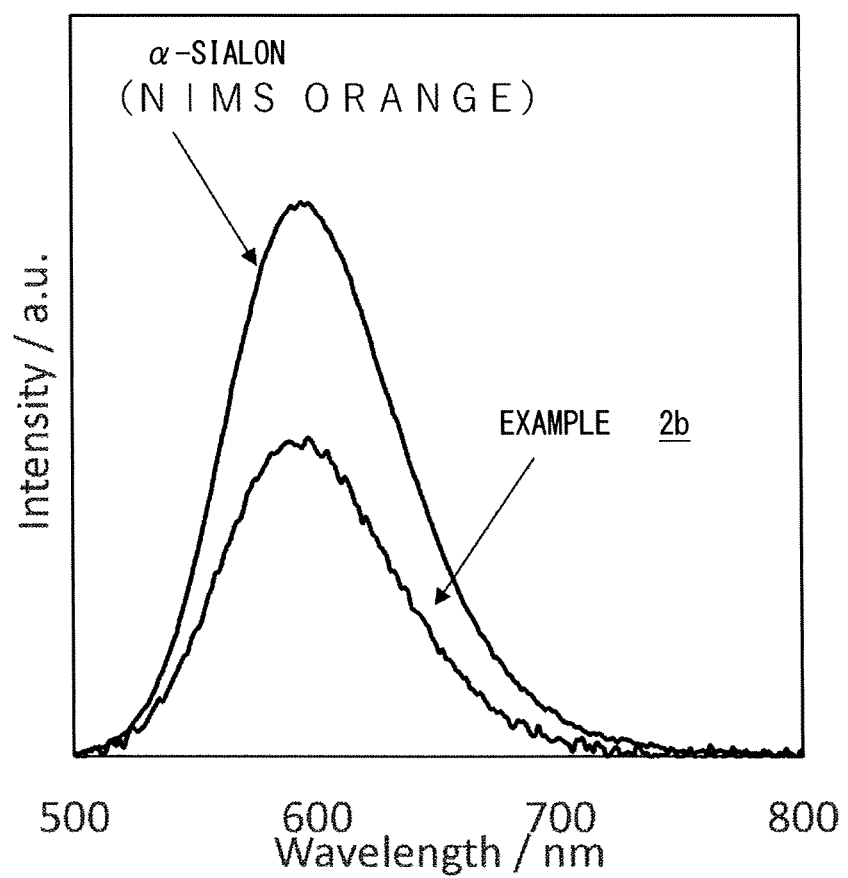
FIG. 7 shows a fluorescence spectrum of a fluorescent member of an Example 2b.
Figure 8:
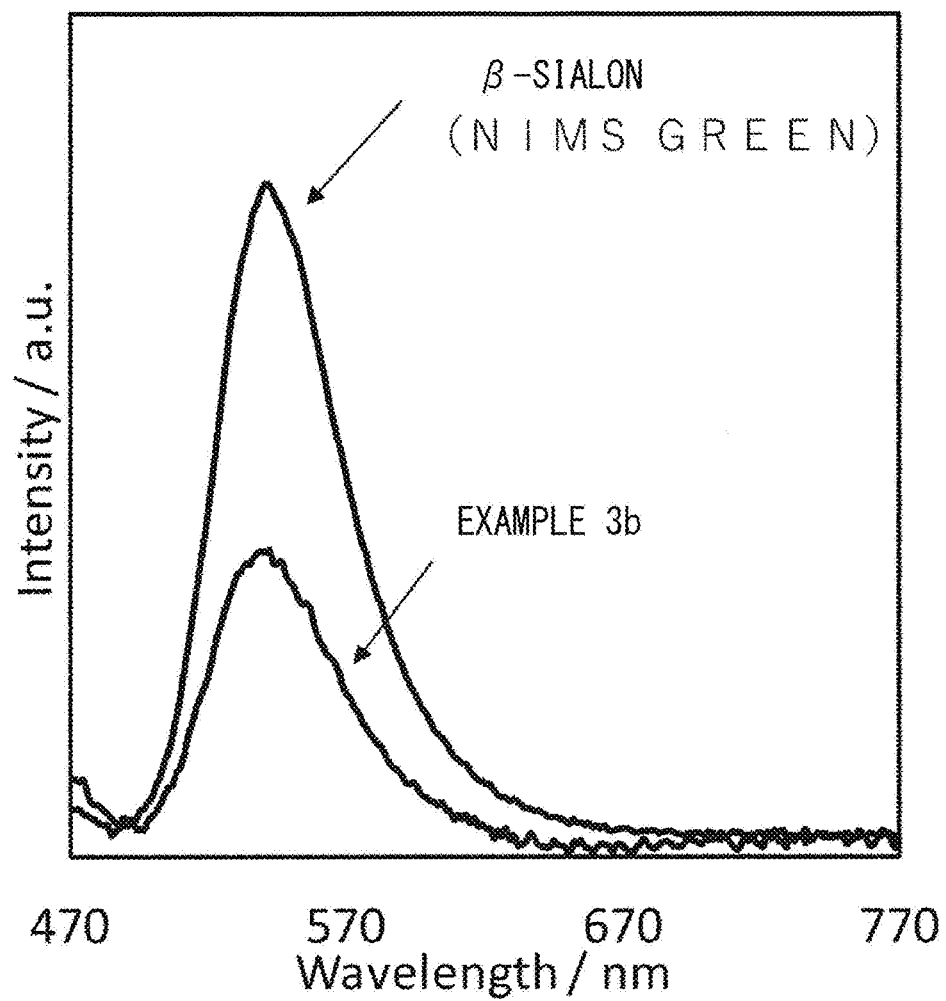
FIG. 8 shows a fluorescence spectrum of a fluorescent member of an Example 3b.

FIG. 6 shows a result of measurement of an emission spectrum of the fluorescent member of the Example 1a. The measurement was carried out by using a quantum efficiency measurement system QE-2000 (Manufactured by Otsuka Electronics Co., Ltd.). In particular, an emission spectrum from 500 nm to 800 nm was measured in a reflection mode by using excitation light of 455 nm. FIG. 6 also shows an emission spectrum of the preform of the Example 1a and an emission spectrum of the fluorescent member of the Comparative Example 2. It was confirmed that: an emission spectrum similar to that of the preform shown in FIG. 6 was obtained for the fluorescent member of the Example 1a, that is, an emission spectrum that originated from the added red phosphor was obtained; and the light-emission intensity of the fluorescent member of the Example 1a was increased. Similar emission spectra were obtained for the fluorescent members according to the other examples in which CASN was used. Meanwhile, no emission spectrum was observed in the fluorescent member of the Comparative Example 2, and therefore it was confirmed that the phosphor particles were inactivated therein. Further, FIG. 7 shows an emission spectrum of the fluorescent member of the Example 2b, and FIG. 8 shows an emission spectrum of the fluorescent member of the Example 3b. The measurement was performed in a manner similar to the measurement described above. Emission spectra of the added phosphors are also shown in these graphs. It was confirmed that, for the emission spectrum of each of the phosphors, the same emission spectrum was obtained for each of the fluorescent members of the Examples 2b and 3b.

(Scanning Transmission Electron Microscope-Energy Dispersive X-ray Spectroscope (STEM-EDX))

Figure 9:
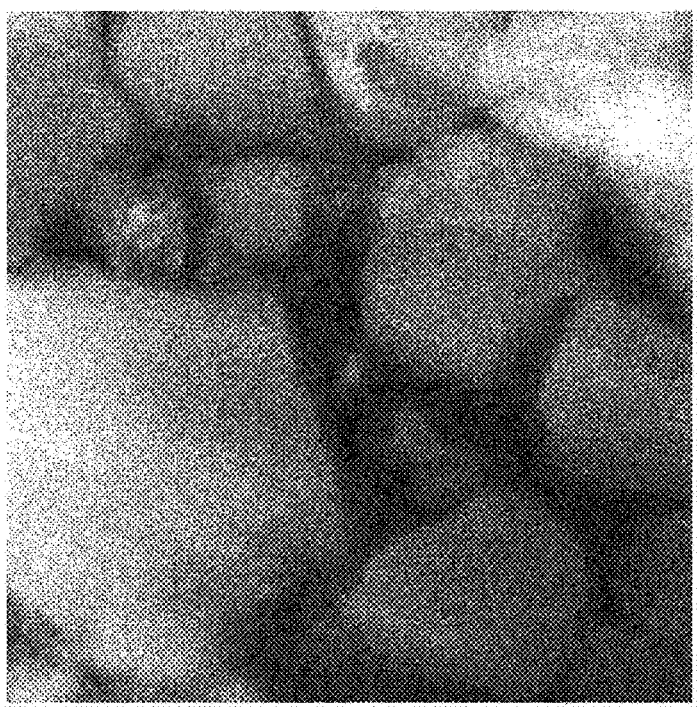
FIG. 9 shows a scanning transmission electron microscope (STEM) image of the Example 1 b.
Figure 10:
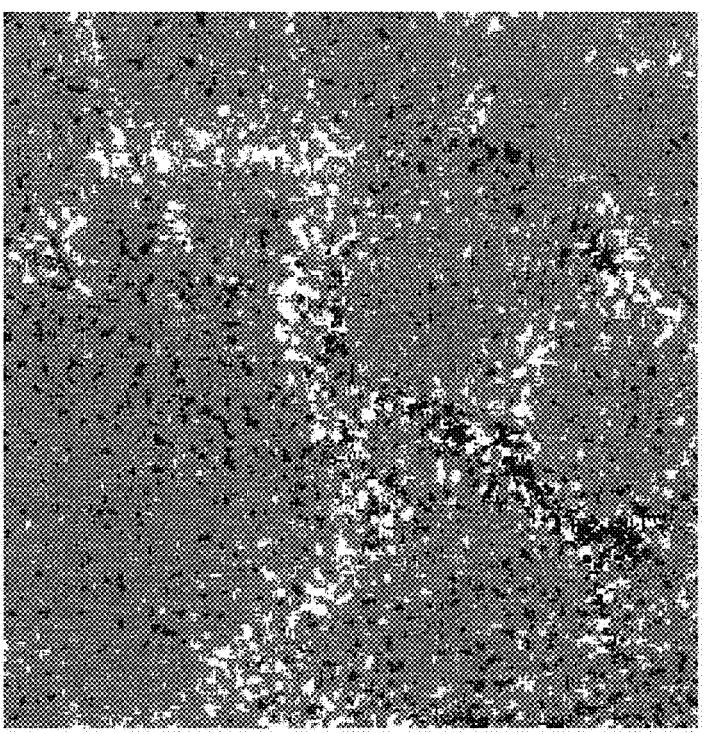
FIG. 10 is an oxygen mapping diagram of the Example 1 b.

In order to observe a structure on a cross section of the fluorescent member of the Example 1b, a measurement sample was manufactured by cutting a bulk sample for which low-temperature sintering was performed into small pieces, and then flaking them into thin pieces by using an ion milling apparatus (Model 691 PIPS manufactured by Gatan). Then, a cross section was observed by an electron microscope, i.e., by using a scanning transmission electron microscope with EDX (a multi-functional analytical transmission electron microscope JEM-F200 manufactured by JEOL Ltd.), and oxygen mapping was performed. FIG. 9 shows a TEM image, and FIG. 10 shows a result of the oxygen mapping. In FIG. 9, there were gaps at grain boundaries between MgO particles, and a lot of needle-like or plate-like particles were observed in the gaps. Further, from the EDX plane analysis shown in FIG. 10, it was understood that the ratio of oxygen of these grain boundary phases was higher than that of the MgO particles. From these images, it was confirmed that gaps between MgO particles were filled with $Mg(OH)_2$.

The Table 1 shows results for the relative density, the average particle diameter, the quantum efficiency, and the thermal conductivity of each experiment example, each example, and each comparative example. The relative density is obtained by dividing the density of a fluorescent member measured according to an Archimedes method in conformity with JIS Z2501:2000 by the true density of a raw-material powder of a matrix component (excluding phosphor particles). The average particle diameter of the magnesium oxide in the fluorescent material was obtained by an intercept method according to ISO13383-1:2012. As for the quantum efficiency, the quantum efficiency for excitation light of a wavelength of 455 nm was obtained in a reflection mode by using a quantum efficiency measurement system QE-2000 (Manufactured by Otsuka Electronics Co., Ltd.). As for the thermal conductivity, the thermal conductivity of each sample was obtained according to JIS R1611 by using a laser flash method thermal constant measuring apparatus TC-9000 (manufactured by Advance Rico, Inc.).

TABLE 1

| | Raw-material powder | Phosphor particles Type | Phosphor particles Content Vol% | Relative density % (before sintering) | Relative density % (after sintering) | Average particle diameter μm (after sintering) | Quantum efficiency % (interior) | Thermal conductivity W/(m K) |
|---|---|---|---|---|---|---|---|---|
| Experiment Example A | TN-1: FNM-G = 7:3 | — | 0 | 65 | 96 | 0.3 | — | — |
| Example 1a | | CASN | 1 | 65 | 92 | — | 64 | 8.1 |
| Example 1b | | CASN | 10 | 65 | 88 | 0.3 | 86 | 6.2 |
| Example 1c | | CASN | 20 | 67 | 92 | — | 83 | 3.9 |
| Example 2a | | α-sialon | 1 | 65 | 92 | — | 59 | — |
| Example 2b | | α-sialon | 10 | 67 | 92 | — | 73 | 5.6 |
| Example 2c | | α-sialon | 20 | 69 | 92 | — | 76 | 4.6 |
| Example 3a | | β-sialon | 1 | 65 | 91 | — | 51 | — |
| Example 3b | | β-sialon | 10 | 66 | 84 | — | 65 | 4.0 |
| Example 3c | | β-sialon | 20 | 68 | 91 | — | 74 | — |
| Comparative Example 1 | | — | 0 | 66 | 66 | 0.3 | — | — |
| Comparative Example 2 | | CASN | 10 | 66 | 69 | 0.2 | — | — |
| Experiment Example B | RF-10CS: 500A = 7:3 | — | 0 | 67 | 91 | 0.2 | — | — |
| Example 4a | | CASN | 1 | 66 | 87 | — | 17 | 6.9 |

TABLE 1-continued

| | Raw-material powder | Phosphor particles Type | Content Vol% | Relative density % (before sintering) | Relative density % (after sintering) | Average particle diameter μm (after sintering) | Quantum efficiency % (interior) | Thermal conductivity W/(m K) |
|---|---|---|---|---|---|---|---|---|
| Example 4b | | CASN | 10 | 67 | 88 | 0.2 | 50 | 5.4 |
| Experiment Example C | RF-10CS: TN-1 = 5:5 | — | 0 | 73 | 97 | — | — | 10.1 |
| Example 5a | | CASN | 10 | 73 | 92 | — | 55 | 6.5 |
| Experiment Example D | 500A | — | 0 | 49 | 85 | — | — | — |
| Example 6a | | CASN | 1 | 47 | 80 | 0.1 | 54 | 2.6 |
| Example 6b | | CASN | 10 | 50 | 84 | — | 84 | 2.8 |
| Comparative Example 3 | Epoxy resin | CASN | 1 | — | — | — | 52 | 0.1 |
| Comparative Example 4 | | CASN | 10 | — | — | — | 81 | 0.1 |

While the internal quantum efficiency of the Example 1a was 64%, the internal quantum efficiency of the Comparative Example 3 was 52%. Further, while the internal quantum efficiency of the Example 1b was 86%, the internal quantum efficiency of the Comparative Example 4 was 81%. As shown in these examples, it was confirmed that the quantum efficiency equal to or higher than those in the related art was obtained in this embodiment.

Further, the thermal conductivities of the Comparative Examples 3 and 4 were obtained according to ISO 22007-4, and all of them were 0.1 W/(m·K).

This application is based upon and claims the benefit of priority from Japanese patent application No. 2019-134868, filed on Jul. 22, 2019, the disclosure of which is incorporated herein in its entirety by reference.

INDUSTRIAL APPLICABILITY

A fluorescent member according to the present invention can be used not only as a member of a light-emitting apparatus, such as a white LED and a high-power LED, but also as a member that can be widely applied to various uses by combining it with a member of, for example, a display such a vacuum fluorescent display (VFD) and a PDP because the fluorescent member has both a high thermal conductivity and a satisfactory fluorescent property. Further, it is also possible to apply the present invention to uses other than those for fluorescent members for wavelength conversion, such as a stress light-emitting element, an electron beam emission light-emitting element, and a thermo-luminescence light-emitting element.

REFERENCE SIGNS LIST

1 SUBSTRATE
2 BLUE LED
3 MATRIX
4 PHOSPHOR PARTICLE
5 FLUORESCENT MEMBER
10 WHITE LED
11 FIRST MATRIX
12 FIRST PHOSPHOR PARTICLE
13 SECOND MATRIX
14 SECOND PHOSPHOR PARTICLE
21 FIRST FLUORESCENT MEMBER
22 SECOND FLUORESCENT MEMBER

The invention claimed is:

1. A fluorescent member, the fluorescent member being composed of a sintered body for wavelength conversion, the sintered body containing:
   a matrix containing magnesium oxide and magnesium hydroxide as main components, gaps between particles of magnesium oxide being filled with magnesium hydroxide; and
   phosphor particles dispersed in the matrix.

2. The fluorescent member according to claim 1, wherein a thermal conductivity of the fluorescent member is 5 W/(m·K) or higher.

3. The fluorescent member according to claim 1, in which a mass ratio of the magnesium hydroxide to the magnesium oxide in the matrix is 0.4 or lower.

4. The fluorescent member according to claim 1, wherein the phosphor particles contain nitride phosphor particles.

5. The fluorescent member according to claim 1, wherein a relative density of the fluorescent member is 85% or higher.

6. The fluorescent member according to claim 1, wherein the sintered body is obtained by:
   obtaining a preform made of a mixture of at least a raw-material powder of the matrix and the phosphor particles; and
   impregnating the preform with water and then sintering the preform under pressure, and
   the sintered body is obtained without performing a high-temperature process at a temperature higher than 250° C. for the preform impregnated with the water.

7. The fluorescent member according to claim 6, wherein an average particle diameter of the magnesium oxide in the matrix obtained by an intercept method according to ISO13383-1:2012 is 0.1 μm to 10 μm.

8. A light-emitting apparatus comprising:
   a semiconductor light-emitting element capable of emitting first light; and
   a fluorescent member according to claim 1 disposed on an emitted-light side of the semiconductor light-emitting element, the fluorescent member being capable of emitting second light by using the first light as excitation light.

9. A method for manufacturing a fluorescent member comprising:
   obtaining a mixture of at least a raw-material powder of a matrix and phosphor particles;
   obtaining a preform by preforming the mixture; and obtaining a sintered body by impregnating the preform with water and then sintering the preform under pressure, wherein the method does not include any process wherein the preform impregnated with the water is processed at a high-temperature higher than 250° C., and the matrix contains magnesium oxide and magnesium hydroxide as main components.

10. The method for manufacturing a fluorescent member described in claim 9, in which an average particle diameter of the magnesium oxide as the raw-material powder, which is obtained from a specific surface area and a density, is 20 nm or larger.

* * * * *